(12) United States Patent
Matocha et al.

(10) Patent No.: US 7,781,312 B2
(45) Date of Patent: Aug. 24, 2010

(54) SILICON CARBIDE DEVICES AND METHOD OF MAKING

(75) Inventors: Kevin Sean Matocha, Rexford, NY (US); Vinayak Tilak, Schenectady, NY (US); Stephen Daley Arthur, Glenville, NY (US); Zachary Matthew Stum, Niskayuna, NY (US)

(73) Assignee: General Electric Company, Niskayuna, NY (US)

( * ) Notice: Subject to any disclaimer, the term of this patent is extended or adjusted under 35 U.S.C. 154(b) by 836 days.

(21) Appl. No.: 11/610,199

(22) Filed: Dec. 13, 2006

(65) Prior Publication Data

US 2008/0146004 A1   Jun. 19, 2008

(51) Int. Cl.
*H01L 21/20*  (2006.01)

(52) U.S. Cl. .............. 438/478; 438/483; 257/E21.054; 257/E21.065; 427/589

(58) Field of Classification Search ............ 438/478, 438/481, 483, 931; 427/589; 257/E21.054, 257/E21.065
See application file for complete search history.

(56) References Cited

U.S. PATENT DOCUMENTS

| | | | |
|---|---|---|---|
| 5,977,564 A * | 11/1999 | Kobayashi et al. | 257/77 |
| 6,407,014 B1 | 6/2002 | Alok | |
| 6,573,534 B1 * | 6/2003 | Kumar et al. | 257/77 |
| 6,734,461 B1 * | 5/2004 | Shiomi et al. | 257/77 |
| 6,835,120 B1 * | 12/2004 | Matsui | 451/41 |
| 7,528,040 B2 | 5/2009 | Das et al. | |
| 2005/0001217 A1 | 1/2005 | Kusumoto et al. | |
| 2005/0118824 A1 | 6/2005 | Achuthan et al. | |
| 2005/0245034 A1 | 11/2005 | Fukuda et al. | |
| 2006/0270103 A1 | 11/2006 | Das et al. | |

* cited by examiner

*Primary Examiner*—Brook Kebede
(74) *Attorney, Agent, or Firm*—Ann M. Agosti

(57) ABSTRACT

A method for fabricating a SiC MOSFET is disclosed. The method includes growing a SiC epilayer over a substrate, planarizing the SiC epilayer to provide a planarized SiC epilayer, and forming a gate dielectric layer in contact with the planarized epilayer.

15 Claims, 3 Drawing Sheets

SILICON CARBIDE DEVICES AND METHOD OF MAKING

BACKGROUND

The invention relates generally to silicon carbide devices and more particularly to silicon carbide MOS devices.

Silicon carbide (SiC) metal oxide semiconductor field effect transistors (MOSFETs) are currently being investigated because of silicon carbide's superior material properties with potential high power switching applications. SiC of 4H polytype is considered attractive for such applications due to its large band gap (3.26 eV), enabling blocking of large voltages with a smaller on resistance. SiC is a crystalline substance that can endure very high temperatures, which obviates the need for device cooling. SiC semiconductor devices can operate at temperatures in excess of 200° C. SiC also has high breakdown field, which is about ten times that of silicon, and a higher thermal conductivity, which is about three times that of silicon. These advantages can lead to reductions in weight, energy dissipation and volume at the system level in diverse applications such as aircraft engines and automotive hybrid vehicles. All types of sensor, logic (ICs), power control and power conditioning devices based on SiC should therefore prove to have advantages over analogous silicon (Si) devices.

A roadblock to realizing silicon carbide's potential has been the higher than expected on-resistance measured in SiC MOS devices. This is primarily due to lower than expected mobilities, both field effect mobility and Hall mobility (~1 to 25 cm$^2$/Vs for a Si face (0001) plane SiC 4H substrate), in silicon carbide inversion layers. The channel mobility (inversion layer mobility) in SiC MOSFETs affects the device conduction loss (thus efficiency) in SiC power MOSFETs.

One way this problem is being currently addressed is by using alternate SiC crystal face orientations, which have shown promise in improving the channel mobility. Others ways of increasing channel mobility include improving the oxidation process to improve the channel mobility. It would be beneficial to have additional techniques for increasing channel mobility.

BRIEF DESCRIPTION

One embodiment of the present invention is a method for fabricating a SiC device. The method includes growing a SiC epilayer over a substrate, planarizing the SiC epilayer to provide a planarized SiC epilayer, and forming a dielectric layer in contact with the planarized epilayer.

Another embodiment of the present invention is a silicon carbide MOS device. The silicon carbide MOSFET includes a source region, a drain region, a gate dielectric layer; a gate electrode, and a SiC planarized base epilayer forming an interface with the gate dielectric layer, wherein the SiC planarized base epilayer, prior to formation of the gate dielectric, has a root mean square (RMS) surface roughness less than about 0.5 nm.

Still another embodiment of the present invention is a silicon carbide MOS device. The silicon carbide MOS device includes a dielectric layer; an electrode disposed in contact with the dielectric layer, and a SiC planarized epilayer forming an interface with the dielectric layer, wherein the SiC planarized epilayer has a root mean square surface roughness less than about 0.5 nm prior to formation of the dielectric layer.

Still another embodiment of the present invention is a silicon carbide MOSFET. The silicon carbide MOSFET includes a source region, a drain region, a gate dielectric layer, a gate electrode, and a SiC planarized base epilayer having a surface with a root mean square surface roughness less than about 0.5 nm prior to formation of the gate dielectric layer, and forming an interface along the surface with the gate dielectric layer, wherein the SiC planarized base epilayer includes an inversion layer conducting carriers between the source and the drain with a mobility greater than about 30 cm$^2$/Vs at an inversion sheet charge density greater than about $3\times10^{12}$ cm$^{-2}$.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
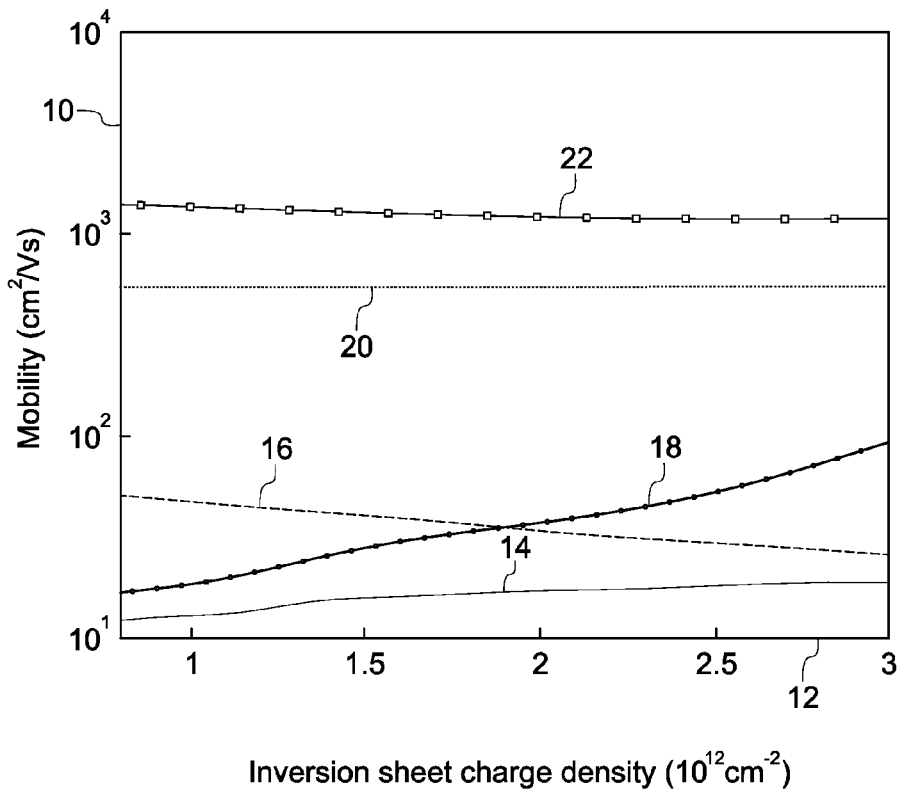
FIG. 1 is a graphical illustration of the variation in mobility with inversion sheet charge density in accordance with one embodiment of the present invention.

Embodiments of the present invention provide SiC devices and methods for fabricating SiC devices.

Some embodiments of the present invention disclose devices, which include an electrode-dielectric layer-SiC semiconductor layer capacitance structure, hereinafter referred to as SiC MOS devices. Embodiments of the present invention include SiC MOS devices and methods for fabricating SiC MOS devices.

Although the following description and representative examples describe SiC MOSFET devices, the embodiments of the present invention are not limited to SiC MOSFET devices. Other SiC devices including a planarized epilayer in contact with a dielectric layer fall within the scope of this invention. All SiC MOS devices such as metal-oxide-semiconductor field effect transistors (MOSFETs), insulated gate bipolar transistors (IGBTs), and MOS Controlled Thyristors (MCTs) fall within the scope of this invention.

In a MOSFET, the gate electrode, the gate dielectric layer, and the semiconductor base (body) layer form the MOS structure. When a voltage is applied across the MOS structure, it modifies the distribution of charges in the semiconductor base layer. If we consider a P-type semiconductor, a positive $V_{GB}$ (gate to body voltage) tends to reduce the concentration of holes and increase the concentration of electrons. If $V_{GB}$ is high enough, the concentration of negative charge carriers near the gate is more than that of positive charges, in what is known as an inversion layer. The inversion layer forms the conductive channel between the source and drain of the MOSFET. Mobility characterizes the ease with which carriers can move by drift (velocity per unit electric field).

The inversion layer or channel mobility can be measured by field effect measurements or Hall measurements. Hall measurements are considered more reliable as they can be used to measure the sheet charge density and mobility independently. The measured mobility values can then be used to infer the contribution of the various scattering mechanisms at work.

Although the Applicants do not wish to be bound by any particular theory, it is believed that there are four mechanisms of scattering which affect the inversion layer mobility, bulk scattering, acoustic phonon scattering, surface roughness scattering and coulomb scattering. The total mobility $\mu_{total}$ is given by $$\frac{1}{\mu_{total}} = \frac{1}{\mu_{bulk}} + \frac{1}{\mu_{ac}} + \frac{1}{\mu_{c}} + \frac{1}{\mu_{sr}} \quad (1)$$

wherein $\mu_{bulk}$ is the bulk mobility, $\mu_{ac}$ is the acoustic phonon mobility, $\mu_{u}$ is the coulombic mobility and $\mu_{sr}$ is the surface roughness mobility. Because $1/\mu_{total}$ is calculated by the reciprocal sum of the various mobilities, the bulk mobility and acoustic phonon mobility contribute very little to the total mobility because of their relatively high values. For example, in the inversion charge densities of interest, for example greater than about $1\times10^{12}$ cm$^{-2}$, the bulk and acoustic phonon mobilities are calculated to be well in excess of 400 cm$^2$/Vs. Thus, these scattering mechanisms do not dominate the scattering time of electrons in SiC MOSFET inversion layers, and currently SiC MOSFET technology is not limited by either bulk mobility or the acoustic phonon mobility. The two scattering mechanisms of interest are coulomb scattering and surface roughness scattering.

FIG. 1 illustrates the total mobility and the mobility due to the four main scattering mechanisms as a function of sheet charge density for MOS-gated structures. The measurement of mobility as a function of different gate biases for different body biases allows one to measure the mobility at different surface electric fields at constant sheet charge densities due to the dependence of depletion charge with body bias. The MOS-gated structures were fabricated on a Si-face, 4H—SiC substrate with a p-type epitaxial layer with a dopant density of $2\times10^{17}$ cm$^{-3}$. Source and drain regions were implanted with nitrogen and a P+ body contact region was formed using an aluminum/carbon co-implant. Both implants were performed at 1000° C. The SiC surface was capped with a graphite layer and the implants were activated at 1675° C. for thirty minutes. After a sacrificial oxidation, the 77 nm gate oxide was thermally grown at 1250° C. in N$_2$O followed by annealing at 1175° C. for 2 hours in NO. A 55 nm thick nickel layer was deposited over the source and drain for ohmic contacts. A 600 nm layer of molybdenum was deposited and patterned for the gate metal. The ohmic contacts were alloyed at 1050° C. for three minutes. Finally, bond pads were formed using a Ti/Ni/Au stack suitable for wire bonding. The finished MOS gated structures were wire bonded to a 28 pin ceramic package and mounted in a vacuum system. All Hall measurements were done with magnetic field of 3500 Gauss. Sheet resistance and Hall voltage were measured after reversing both the direction of flow of current and direction of magnetic field so as to remove DC offsets from the Hall Voltage. A Keithley 2182 nano voltmeter was used to measure the voltages so as to minimize the effect of the high impedance of the 4H SiC samples. The Hall coefficient is assumed to be 1. Hall mobility and inversion charge density values across several samples were measured within 10% of each other at a given gate voltage. Hall mobility and sheet charge density were measured both as a function of gate bias and as function of body bias.

FIG. 1 illustrates the variation in mobility 10 with inversion sheet charge density 12. Line profiles 14, 16, 18, 20 and 22 illustrate the change in the total mobility, surface roughness mobility, coulombic mobility, bulk mobility and acoustic phonon mobility, respectively. As discussed earlier, and as can be seen from FIG. 1, bulk mobility and acoustic phonon mobility values at the charge densities of interest are too high to contribute significantly to the total mobility. The Applicants have discovered that two different scattering mechanisms dominate depending upon the effective electric field. At inversion sheet charge densities of less than about $1.8\times10^{12}$ cm$^{-2}$, coulomb scattering dominates, and, at higher inversion densities, surface roughness scattering dominates. In applications such as high power switching devices, typical p-well doping levels are from about $5\times10^{16}$ to about $2\times10^{17}$ cm$^{-3}$, and typical operation surface electric fields are in the range of about 1 MV/cm. Under these conditions, surface roughness scattering will be an important factor limiting mobility.

One embodiment of the present invention is a method for fabricating a SiC MOSFET wherein, prior to formation of the gate dielectric layer, a SiC epilayer forming an interface with the gate dielectric layer is subjected to planarization to reduce the surface roughness of the SiC epilayer forming the interface with the gate dielectric. In one embodiment, a lowering of surface roughness of the SiC epilayer leads to an increase in the surface roughness mobility, $\mu_{sr}$, which consequently leads to an increase in the total mobility, provided all other mobility factors remain the same. In some embodiments, the substrate may be polished before growing an SiC epilayer. The grown SiC epilayer may still exhibit a level of roughness, which can have a negative impact on the mobility. Planarization of the SiC epilayer before the formation of an interface with the dielectric layer is thus believed by the Applicants to be more advantageous for the SiC epilayer-gate dielectric layer interface than mere polishing of semiconductor substrates before growing an epilayer.

Figure 2:
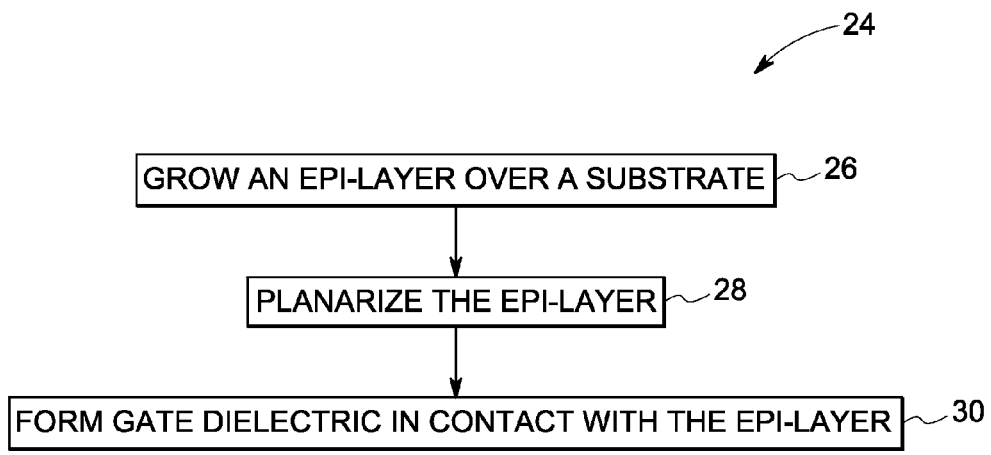
FIG. 2 is a flow chart illustrating a method for fabricating a MOSFET in accordance with one embodiment of the present invention.

FIG. 2 is a flow chart illustrating a method 24 for fabricating a MOSFET in accordance with one embodiment of the present invention. In step 26 a SiC epilayer is epitaxially grown over a substrate. In step 28, the SiC epilayer surface is planarized to provide a planarized SiC epilayer. In step 30, a gate dielectric layer is formed in contact with the planarized epilayer. The method may include other preceding, intervening or subsequent steps to the steps 26, 28, and 30 to form other regions of the MOSFET. One embodiment is a SiC MOSFET made in accordance with the method illustrated in FIG. 2.

Non-limiting examples of planarization include chemical mechanical polishing, electrochemical mechanical polishing, chemical polishing, inductively coupled plasma (ICP) etching, reactive ion etching (RIE), and hydrogen etching.

Chemical mechanical polishing (CMP) is a process of smoothing and planarizing surfaces with a combination of chemical and mechanical forces to remove the microscopic topographic features on a wafer and is thus a hybrid of chemical etching and free abrasive polishing. In one example, the process uses an abrasive and corrosive chemical slurry in conjunction with a polishing pad and retaining ring, typically of a greater diameter than the wafer. The pad and wafer are pressed together by a dynamic polishing head and held in place by a plastic retaining ring. The dynamic polishing head is rotated at different rates, with different axes of rotation (i.e., not concentric). The chemicals in the slurry react with and/or weaken the material to be removed. The abrasive accelerates this weakening process and the polishing pad helps to wipe the reacted materials from the surface. The process removes material and tends to even out any irregular topography, making the wafer flat or planar.

Electrochemical mechanical planarization technology is a process combining anodic oxidation with normal CMP technique, i.e., anodically oxidizing the SiC surface while removing the oxide using oxide CMP. In chemical polishing, material is removed from the surface of the sample by a dissolving process using aggressive and chemical polishing agents that do not damage the sub-surface structure. Hydrogen etching involves exposing the growth surface to hydrogen flow at high temperatures to obtain surfaces wherein surface scratches are minimized and large atomically flat terraces are obtained.

In one embodiment, an etching process is used to planarize the SiC epilayer. Non-limiting examples of etching processes, which may be used to planarize the SiC epilayer, include reactive ion etching and inductively coupled plasma etching. In reactive etching, the substrate with the SiC epilayer is placed in a sealed chamber where a plasma is created between two capacitive plates. The plasma etches the epilayer. As sharper features of the epilayer layer tend to etch faster, the technique can be used to polish/planarize the epilayer. ICP etching is similar to RIE. The inductively coupled plasma is a type of plasma source in which the energy is supplied by electrical currents which are produced by electromagnetic induction.

Figure 3:
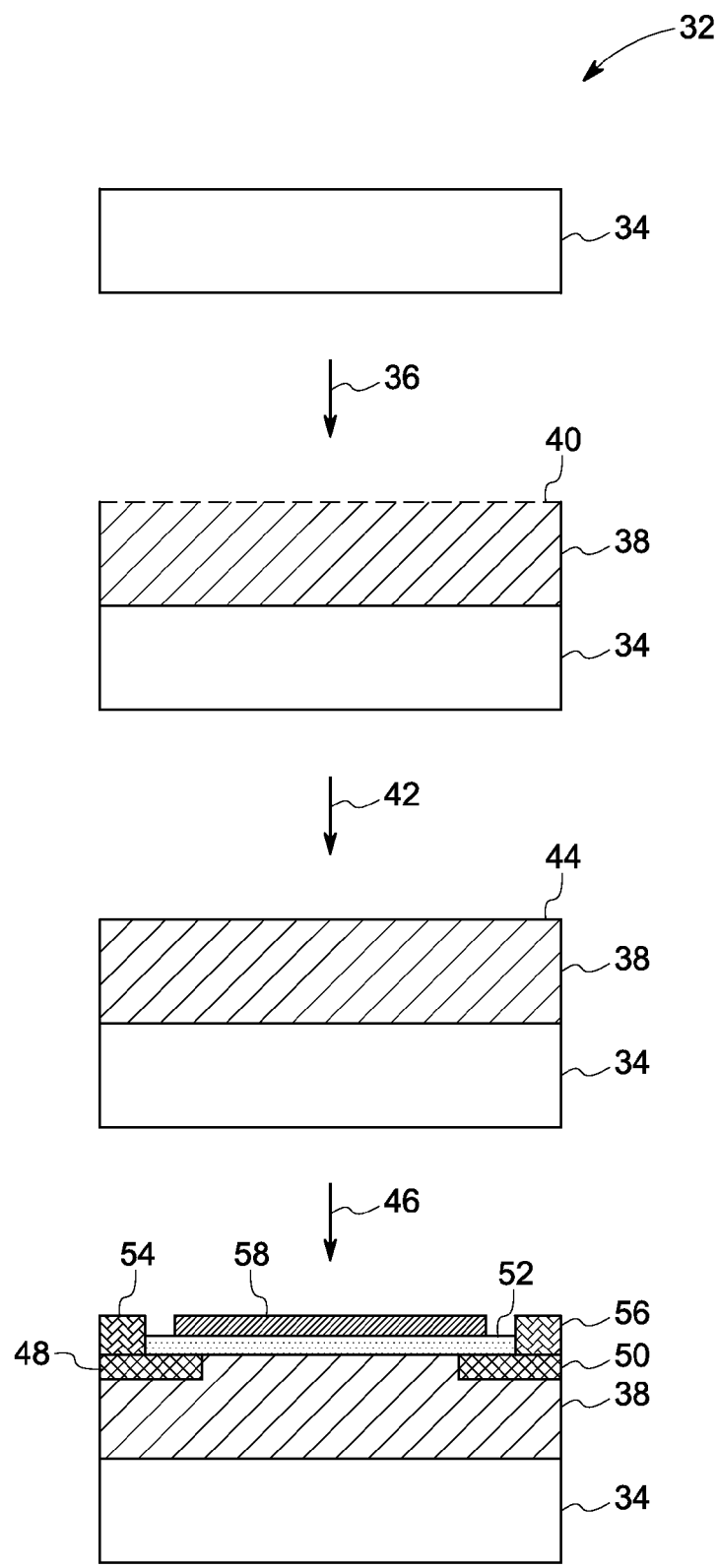
FIG. 3 is a schematic representation of a method for fabricating a MOSFET in accordance with one embodiment of the present invention.

FIG. 3 is a schematic representation of a process for fabricating a SiC MOSFET, in a more specific variation of the method illustrated in FIG. 2, in accordance with one embodiment of the present invention. The method 32 includes providing a substrate 34. In step 36 an epilayer 38 with a surface 40 is epitaxially grown over the substrate 30. In step 42, the surface 40 is planarized to reduce surface roughness to provide an epilayer 38 with a planarized surface 44 (a planarized SiC epilayer). In step 46, other regions of the MOSFET are fabricated in one or more steps to complete the device. In one embodiment, after planarization of the epilayer 38, source and drain regions 48 and 50 are formed in the epilayer 38 by ion implantation or diffusion. A gate dielectric layer 52 is disposed in contact with the planarized surface 44 of the epilayer 38. In one embodiment, a native oxide $SiO_2$ layer is formed as the gate dielectric layer. Source and drain contacts 54 and 56 are formed. A gate electrode 58 is disposed over the gate dielectric layer 52.

Figure 4:
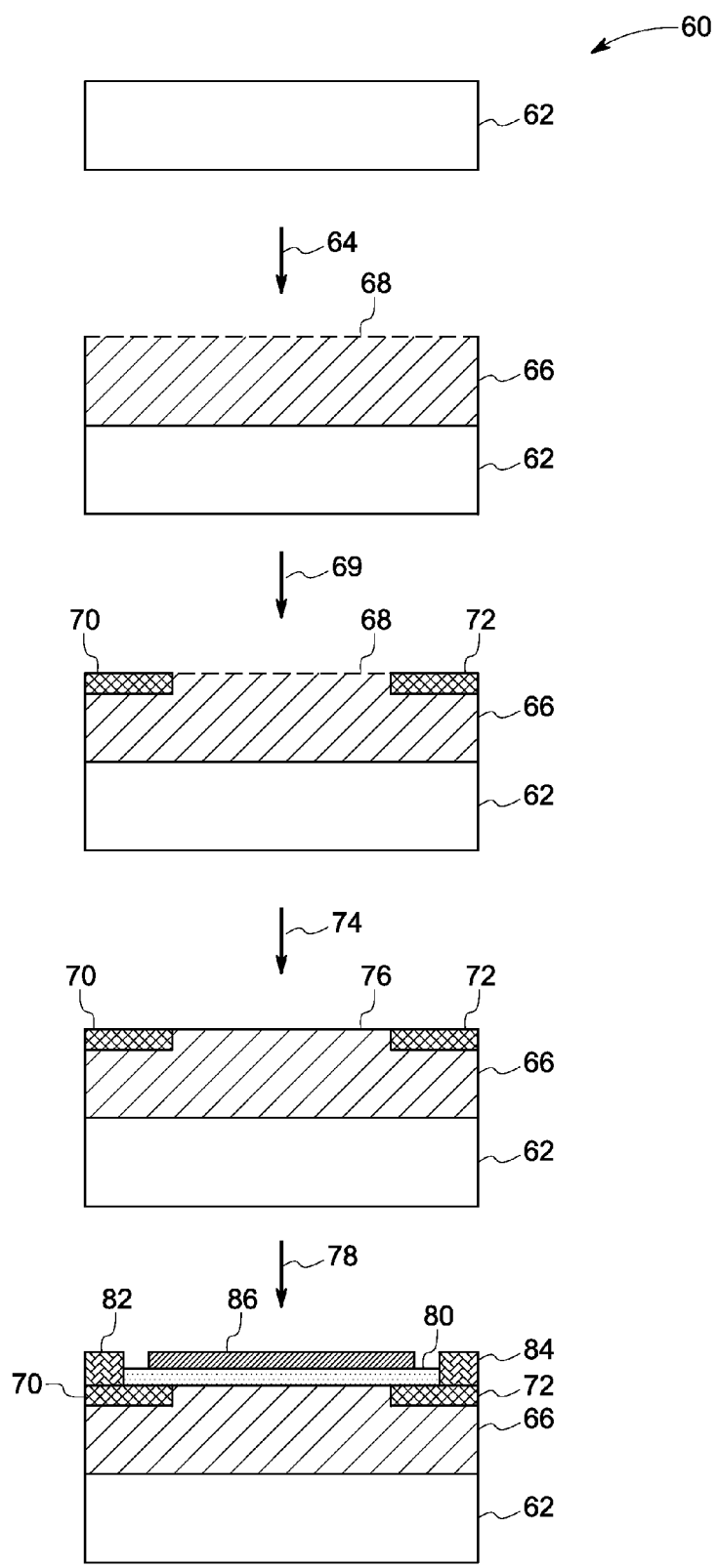
FIG. 4 is a schematic representation of a method for fabricating a MOSFET in accordance with another embodiment of the present invention.

An alternate embodiment to the method shown in FIG. 3, another more specific variation of the method illustrated in FIG. 2, is the method shown in FIG. 4. FIG. 4 is a schematic representation of a process for fabricating a SiC MOSFET in accordance with another embodiment of the present invention. The method 60 includes providing a substrate 62. In step 64 an epilayer 66 with a surface 68 is epitaxially grown over the substrate 62. In one embodiment as shown in FIG. 4, in step 69 source and drain regions 70 and 72 are formed in the epilayer 66 by ion implantation or diffusion. In this embodiment, the planarization of the epilayer follows the formation of the source and drain regions. In step 74, the surface 68 is planarized to reduce surface roughness to provide an epilayer 66 with a planarized surface 76 (a planarized SiC epilayer). In step 78, other regions of the MOSFET are fabricated in one or more process steps to complete the device. A gate dielectric layer 80 is disposed in contact with the planarized surface 76 of the epilayer 66. Source and drain contacts 82 and 84 are formed. A gate electrode 86 is disposed over the gate dielectric layer 80 to complete the device.

Although the embodiments described herein have been described with respect to certain structural embodiments of a lateral MOSFET, the invention is not restricted to the embodiments described here. Other MOSFET structures including other lateral MOSFETS and vertical MOSFETs fall within the scope of this invention.

In one embodiment of the present invention, an RMS surface roughness of the planarized epilayer is less than about 0.5 nm. As used herein and throughout the specification, the values of the surface roughness of the planarized SiC epilayer is as measured prior to the formation of the dielectric in contact with the SiC planarized epilayer. In one embodiment, the surface roughness values of the SiC planarized epilayer measured subsequent to planarization and prior to the formation of the dielectric, and the surface roughness values measured subsequent to the formation of the dielectric, are different. In one embodiment, a surface roughness value measured subsequent to formation of the dielectric, for example by oxidation (measured after removing the oxide layer after formation), is higher than a surface roughness value measured post planarization and prior to formation of the dielectric.

In a further embodiment, the RMS surface roughness of the planarized epilayer is less than about 0.3 nm. In a still further embodiment, an RMS surface roughness of the planarized epilayer is less than or equal to about 0.2 nm.

In one embodiment, an RMS surface roughness value of the epilayer after planarization is lower by a factor of 2 compared to an RMS surface roughness value prior to planarization. In a further embodiment, the RMS surface roughness value of the epilayer after planarization is lower by a factor of 5 compared to an RMS surface roughness value prior to planarization.

Another embodiment of the present invention is a silicon carbide MOSFET including a source region, a drain region, a gate dielectric layer, a gate electrode, and a SiC planarized base epilayer forming an interface with the gate dielectric layer, wherein the SiC planarized base epilayer having an RMS surface roughness less than about 0.5 nm. In a further embodiment, the average surface roughness is less than or equal to about 0.2 nm.

In one embodiment, the SiC planarized base epilayer is of 4H—SiC polytype. The base epilayer-gate dielectric interface is formed along a C-face of a substantially [000-1] plane of the SiC planarized base epilayer having an RMS surface roughness about 0.4±0.1 nm. As used herein and in the rest of the specification, a substantially [000-1] plane refers to a plane within plus or minus 10 degrees off an ideal [000-1] plane.

In another embodiment, the SiC planarized base epilayer is of 4H—SiC polytype, wherein the base epilayer-gate dielectric interface is formed along an Si-face of a substantially [0001] plane of the SiC planarized base epilayer having an RMS surface roughness about 0.15±0.05 nm. As used herein and in the rest of the specification, a substantially [0001] plane refers to a plane within plus or minus 10 degrees off an ideal [0001] plane. In a further embodiment the SiC planarized base epilayer has an RMS surface roughness about 0.1±0.05 nm.

Still another embodiment of the present invention is a silicon carbide MOSFET, where the SiC planarized base epilayer is of 4H—SiC. The interface is formed along a substantially [11-20] plane of the SiC planarized base epilayer having an RMS surface roughness about 0.4±0.1 nm. As used herein and in the rest of the specification, a substantially [11-20] refers to a plane within plus or minus 10 degrees off an ideal [11-20] plane. In a further embodiment the SiC planarized base epilayer along a substantially [11-20] plane has an RMS surface roughness about 0.2±0.1 nm.

Yet another embodiment of the present invention is a silicon carbide MOSFET where the SiC planarized base epilayer is of 6H—SiC polytype. In one embodiment, the interface is formed along a C-face of a substantially [000-1] plane of the SiC planarized base epilayer having an RMS surface roughness about 0.4±0.05 nm. In another embodiment, the interface is formed along an Si-face of a substantially [0001] plane of the SiC planarized base epilayer having an RMS surface roughness about 0.2±0.1 nm.

In one embodiment, the silicon carbide base epilayer is p-doped. Non-limiting examples of p-dopants include boron and aluminum. In another embodiment, the silicon carbide base epilayer is n-doped. Suitable n-dopants include nitrogen, phosphorous, antimony, and arsenic. In one embodiment, the SiC planarized base epilayer has a dopant concentration in a range from about $3\times10^{16}$ cm$^{-3}$ to $3\times10^{17}$ cm$^{-3}$.

In one embodiment of the present invention, a silicon carbide MOSFET with the planarized base epilayer has an inversion layer total mobility greater than a corresponding silicon carbide MOSFET without a planarized base epilayer. In one embodiment, during operation of a MOSFET, device having a planarized base epilayer with an RMS surface roughness less than about 0.5 nm, the inversion layer total mobility is greater than about 15 cm$^2$/Vs at an inversion sheet charge density greater than about $2\times10^{12}$ cm$^{-2}$. In a further embodiment, during operation, the inversion layer total mobility is greater than about 20 cm$^2$/Vs at an inversion sheet charge density greater than about $2\times10^{12}$ cm$^{-2}$. In a still further embodiment of the present invention, during operation, the inversion layer total mobility is greater than about 20 cm$^2$/Vs at an inversion sheet charge density greater than about $3\times10^{12}$ cm$^{-2}$. In yet another embodiment of the present invention, during operation the inversion layer total mobility is greater than about 30 cm$^2$/Vs at an inversion sheet charge density greater than about $3\times10^{12}$ cm$^{-2}$.

In one embodiment of the present invention, a silicon carbide MOSFET with the planarized base epilayer has an inversion layer surface roughness mobility greater than a corresponding silicon carbide MOSFET without a planarized base epilayer. In one embodiment, the silicon carbide MOSFET during operation of a MOSFET device having a planarized base epilayer with an RMS surface roughness less than about 0.5 nm, has an inversion layer surface roughness mobility during operation greater than about 30 cm$^2$/Vs at an inversion sheet charge density greater than about $2\times10^{12}$ cm$^{-2}$. In another embodiment, the silicon carbide MOSFET has an inversion layer surface roughness mobility during operation greater than about 20 cm$^2$/Vs at an inversion sheet charge density greater than about $3\times10^{12}$ cm$^{-2}$. In another embodiment, the silicon carbide MOSFET has an inversion layer surface roughness mobility during operation greater than about 25 cm$^2$/Vs at an inversion sheet charge density greater than about $3\times10^{12}$ cm$^{-2}$.

Still another embodiment of the present invention is a silicon carbide MOSFET. The silicon carbide MOSFET includes a source region, a drain region, a gate dielectric layer, a gate electrode, and a SiC planarized base epilayer having a surface with a root mean square surface roughness less than about 0.5 nm and forming an interface along the surface with the gate dielectric layer. During operation, the SiC planarized base epilayer includes an inversion layer conducting carriers between the source and the drain with a mobility greater than about 30 cm$^2$/Vs at an inversion sheet charge density greater than about $3\times10^{12}$ cm$^{-2}$.

In one embodiment, during operation, the inversion layer surface roughness mobility during operation is greater than about 45 cm$^2$/Vs at an inversion sheet charge density greater than about $2\times10^{12}$ cm$^{-2}$. In one embodiment, during operation, the inversion layer surface roughness mobility during operation is greater than about 35 cm$^2$/Vs at an inversion sheet charge density greater than about $3\times10^{12}$ cm$^{-2}$.

In one embodiment, the inversion layer total mobility during operation is greater than about 50 cm$^2$/Vs at an inversion sheet charge density greater than about $1.8\times10^{12}$ cm$^{-2}$, where the SiC planarized base epilayer has a dopant concentration in a range from about $3\times10^{16}$ cm$^{-3}$ to $3\times10^{17}$ cm$^{-3}$.

In another embodiment, the inversion layer surface roughness mobility during operation is greater than about 25 cm$^2$/Vs at an inversion sheet charge density greater than about $3\times10^{12}$ cm$^{-2}$, where the SiC planarized base epilayer has a dopant concentration in a range from about $3\times10^{16}$ cm$^{-3}$ to $3\times10^{17}$ cm$^{-3}$.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A method for fabricating a device comprising:
    growing a SiC epilayer over a substrate;
    planarizing the SiC epilayer to provide a planarized SiC epilayer; and
    forming a dielectric layer in contact with the planarized epilayer;
    wherein planarizing the SiC epilayer comprises inductively coupled plasma (ICP) etching or reactive ion etching (RIE).

2. The method of claim 1, further comprising forming an electrode layer in contact with the dielectric layer to form a MOS device.

3. The method of claim 2, wherein the device is an IGBT device or a MCT device.

4. The method of claim 2, wherein the device is a MOSFET.

5. The method of claim 4, further comprising forming source and drain regions prior to planarizing the SiC epilayer.

6. The method of claim 4, further comprising forming source and drain regions subsequent to planarizing the SiC epilayer.

7. The method of claim 1, wherein a root mean square surface (RMS) roughness of the planarized epilayer prior to formation of the dielectric is less than about 0.5 nm.

8. The method of claim 1, wherein an RMS surface roughness of the planarized epilayer prior to formation of the dielectric is less than or equal to about 0.2 nm.

9. The method of claim 1, wherein an RMS surface roughness of the planarized epilayer prior to formation of the dielectric is in a range from about 0.2 nm to about 0.1 nm.

10. The method of claim 1, wherein the SiC planarized base epilayer comprises 4H-SiC, wherein the interface is formed along a C-face of a [000-1] plane of the SiC planarized base epilayer having an RMS surface roughness, prior to formation of the gate dielectric, of about 0.4±0.1 nm.

11. The method of claim 1, wherein the SiC planarized base epilayer comprises 4H-SiC, wherein the interface is formed along an Si-face of a substantially [0001] plane of the SiC planarized base epilayer having an RMS surface roughness, prior to formation of the gate dielectric, of about 0.1±0.05 nm.

12. The method of claim 1, wherein the SiC planarized base epilayer comprises 4H-SiC, wherein the interface is formed along a substantially [11-20] plane of the SiC planarized base epilayer having an RMS surface roughness, prior to formation of the gate dielectric, of about 0.2±0.1 nm.

13. The method of claim 1, wherein the SiC planarized base epilayer comprises 6H-SiC, wherein the interface is formed along a C-face of a substantially [000-1] plane of the SiC planarized base epilayer.

14. The method of claim 1, wherein the SiC planarized base epilayer comprises 6H-SiC, wherein the interface is formed along an Si-face of a substantially [0001] plane of the SiC planarized base epilayer having an RMS surface roughness, prior to formation of the gate dielectric, of about 0.2±0.1 nm.

15. A method for fabricating a device comprising:
growing a SiC epilayer over a substrate;
planarizing the SiC epilayer to provide a planarized SiC epilayer; and
forming a dielectric layer in contact with the planarized epilayer;
wherein planarizing the SiC epilayer comprises hydrogen etching the SiC epilayer by exposing the SiC epilayer surface to hydrogen flow.

* * * * *